(12) United States Patent
Matsumoto

(10) Patent No.: US 6,229,348 B1
(45) Date of Patent: May 8, 2001

(54) BALANCE-TO-SINGLE SIGNAL CONVERTING CIRCUIT

(75) Inventor: Tetsuya Matsumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/115,536

(22) Filed: Jul. 15, 1998

(30) Foreign Application Priority Data

Jul. 15, 1997 (JP) .................................................... 9/189835

(51) Int. Cl.⁷ ....................................................... H03K 5/22
(52) U.S. Cl. ............................................. 327/67; 327/345
(58) Field of Search ................................ 327/67, 68, 73, 327/54, 345, 551, 552

(56) References Cited

U.S. PATENT DOCUMENTS

| | | | |
|---|---|---|---|
| 4,910,455 | * | 3/1990 | Nadd ........................................ 327/73 |
| 4,922,132 | * | 5/1990 | Horvitz et al. ........................... 327/73 |
| 5,491,434 | * | 2/1996 | Harnishfeger et al. .................. 327/67 |

FOREIGN PATENT DOCUMENTS

| | | |
|---|---|---|
| 62-26918 | 2/1987 | (JP) . |
| 3-227105 | 10/1991 | (JP) . |
| 6-85606 | 3/1994 | (JP) . |

* cited by examiner

*Primary Examiner*—Jung Ho Kim
(74) *Attorney, Agent, or Firm*—Sughrue, Mion, Zinn, Macpeak & Seas, PLLC

(57) ABSTRACT

A balance-to-single signal converting circuit of the present invention includes an anti aliasing filter (AAF) comprising an operational amplifier supplied at a non-inversion input terminal with a voltage obtained by dividing a power source voltage, for example Vdd, by resistors coupled between a power source and, for example, a ground. Each of the of the resistors may have a resistance value about twice as large as that of a resistor coupled between an inversion input terminal of the operational amplifier and the output of the operational amplifier. Accordingly, a balance-to-single signal converting circuit can be constructed without inputting to the AAF a reference voltage from a reference voltage generating circuit which is supplied to a switched capacitor filter.

13 Claims, 12 Drawing Sheets

Inp

Inn

Vn  Vc

Vp  Vc

V<sub>OUT</sub>  Vc

BALANCE-TO-SINGLE SIGNAL CONVERTING CIRCUIT

BACKGROUND OF THE INVENTION

1. Field of the Invention

The present invention relates to a balance-to-single signal converting circuit which converts balance (differential) signals into a single end signal.

2. The Related Art

A post filter for smoothing the signal waveform after DA (digital/analog) conversion is provided between a DAC (DA converter) and a data output terminal. FIG. 9 shows a block diagram of a conventional post filter. This post filter comprises an SCF (Switched Capacitor Filter) 1, an AAF (Anti Aliasing Filter) 102 and a reference voltage generator 3. The reference voltage generator 3 generates a reference voltage 20 which is half the voltage of a power source voltage Vdd.

As shown in FIG. 10, the SCF 1 converts input signals Inp and Inn, which are signals equivalent to DA converted signals, into differential signals based on the reference voltage 20 (Vc), to output differential signals Vn and Vp.

The AAF 102 removes signals of a predetermined frequency or higher from the differential signals Vp and Vn so as to smooth these signals and converts these signals into a single end signal while amplifying the single end signal with a fixed amplification rate to output the signal as an output signal Vout. That is, the AAF 102 functions as a balance-to-single signal converting circuit having an low pass filter (LPF) characteristic.

As shown in FIG. 11, the AAF 102 comprises resistors 7 and 8 having resistance values $r_1$, resistors 5 and 19 each having resistance values $r_2$, capacitors 10 and 11 each having capacitance values C, and an operational amplifier 4. The differential signal Vn is inputted into an inversion input terminal–of the operational amplifier 4 through the resistor 7. The differential signal Vp is inputted into a non-inversion input terminal+of the operational amplifier 4 through the resistor 8. The resistor 5 and the capacitor 11 are connected in parallel between an output terminal and the inversion input terminal of the operational amplifier 4. Further, the resistor 19 and the capacitor 10 are connected in parallel between a reference voltage terminal receiving the reference voltage 20 and the non-inversion input terminal of the operational amplifier 4.

For the sake of simplification of explanation, assuming that capacitance value C=0, the AAF 102 is a balance-to-single signal converting circuit without the LPF characteristic, and that the reference voltage generator 3 is the power source having an output impedance r, the circuit has the construction as shown in FIG. 12. The output impedance r is represented as a resistor 81, and a power source 82 is a direct current power source of an output voltage Vc.

In FIG. 12, a voltage Vx at a node x is expressed by equation 1.

$$Vx = \frac{r_2 \times Vn + r_1 \times Vout}{r_1 + r_2} \quad (1)$$

Further, a voltage Vy at a node y is similarly expressed by equation 2.

$$Vy = \frac{r_1 \times Vc + (r + r_2) \times Vp}{r_1 + r_2 + r} \quad (2)$$

Assuming that the open loop gain of the operational amplifier 4 is extremely large, the output signal Vout is expressed by equation 3.

$$Vout = \frac{1 + r_2/r_1}{r_1 + r_2 + r}\{r_1 \times Vc + (r + r_2) \times Vp\} - \frac{r_2}{r_1}Vn \quad (3)$$

This equation can be transformed into equation 4.

$$Vout = \frac{1}{(1 + r/(r_1 + r_2))}Vc + \frac{r_2}{r_1}\left(\frac{1 + r/r_2}{1 + r/(r_1 + r_2)}Vp - Vn\right) \quad (4)$$

As understood from the first term of equation 4, if the output impedance r=0 does not hold, the central potential of the output signal Vout becomes a voltage resulting from multiplying the output voltage Vc of the power source 82 by $1/(1+r/(r_1+r_2))$. If r=0 holds, the central potential of the output signal Vout is the output voltage Vc of the power source 82.

Further, as understood from the second term of equation 4, if r=0 does not hold, the voltage of the differential signal Vp becomes a voltage multiplied by $(1+r/r_2)/(1+r/(r_1+r_2))$ and multiplied by the total gain $(r_2/r_1)$. If ideally r=0 holds, the voltage of the output signal Vout is as expressed by equation 5.

$$Vout = Vc + \frac{r_2}{r_1}(Vp - Vn) \quad (5)$$

As shown in the above equation 5, if the output impedance r of the reference voltage generator 3 is not "0", variation of middle point potential and distortion occur in the output signal Vout.

For this reason, in one means for obtaining the output impedance r closer to "0", the post filter has been arranged such that the circuit current of the reference voltage generator 3 is increased to lower the output impedance. In the alternative, as shown in FIG. 13, a bonding pad 92 is provided to output the reference voltage 20 as the output from the reference voltage generator 3 to an external terminal of the LSI, and the terminal is connected to a large capacity capacitor 91 having a capacitance value CL, to lower the alternating impedance.

However, in the former method, current consumption increases. In the later method, as the bonding pad 92 is provided, the chip area increases, and the capacitor 91 is required as an external component, which increases the cost.

FIG. 14A shows an example of a circuit diagram of a reference voltage generator 23 having a concrete arrangement of the reference voltage generator 3. FIG. 14B shows an equivalent circuit of the circuit in FIG. 14A.

As shown in FIG. 14A, the reference voltage generator 23 comprises a p-channel MOS transistor 103, an n-channel MOS transistor 104 and an output terminal outputting the reference voltage 20. As shown in FIG. 14B, the equivalence circuit comprises a constant-current source 106 with a current Ib and a resistor 105 with a conductance $g_{mp}$. Note that $g_{mp}$ is the conductance of the MOS transistors, and Vdd, a power source voltage.

From FIG. 14B, a voltage $Vc_0$ of the reference voltage 20 when no load is connected to the output terminal is as expressed by equation 6.

$$V_{C0} = Vdd - Ib/g_{mp} \quad (6)$$

FIG. 15 shows a circuit diagram in a case where the reference voltage generator 23 replaces the reference voltage generator 3 in FIG. 12. In this case, as the reference terminal is connected to load, the voltage Vc of the reference voltage 20 is as expressed by equation 7.

$$V_C = \frac{Vp}{1+g_{mp}R} + \frac{Vdd - Ib/g_{mp}}{1+1/g_{mp}R} \quad (7)$$

This equation can be transformed into equation 8.

$$V_C = \frac{Vp}{1+g_{mp}R} + \frac{Vc0}{1+1/g_{mp}R} \quad (8)$$

From equation 8, it is understood that the reference voltage 20 output from the reference voltage generator 23 fluctuates depending on the differential signal Vp as input.

Further, as the reference voltage generator 23 comprises MOS transistors, flicker noise is added to the output. Flicker noise $V_{1/f}$ is expressed by equation 9.

$$V_{1/f}^2 = \frac{K_f}{C_{ox}WL}\Delta\frac{f}{f} \quad (9)$$

Note that Cox is an oxide film capacity, L and W, a gate length and a gate width of the respective MOS transistors, and Kf, a flicker coefficient.

Note that assuming that $R=r_1+r_2$ holds, working through the above equations 1 to 9, the voltage Vc of the reference voltage 20 is as expressed by equation 10.

$$V_C = \frac{Vp}{1+g_{mp}R} + \frac{Vc0}{1+1/f_{mp}R} + V_{1/f} \quad (10)$$

Note that the first term $Vp/(1+g_{mp}R)$ of equation 10 represents noise resulting from the differential signal Vp as input, the second term $Vc/(1+1/g_{mp}R)$ represents a fixed value of error in load driving, and the third term $V_{1/f}$ represents flicker noise. This fluctuation and noise of the reference voltage 20 directly appears as fluctuation and noise in the output signal Vout.

The above-described conventional balance-to-single signal converting circuits have the following problems:
(1) where the reference voltage generator is increased to lower the output impedance, consumption current increases;
(2) where a large capacity capacitor is added as an external device to the LSI chip to lower the alternating impedance, a bonding pad and wiring must be provided from the reference voltage circuit to an external pin of the chip (to connect to large capacity capacitor), which increases the chip area in addition to require external parts, thus increasing the cost; and
(3) where active transistors are used as the reference voltage circuit, noise occurs and directly appears in the output signal.

SUMMARY OF THE INVENTION

It is therefore an object of the present invention to provide a balance-to-single signal converting circuit which operates without influence of the output impedance of a reference voltage generator and noise occurring in the reference voltage generator.

A balance-to-single signal converting circuit of the present invention comprises: an operational amplifier; a first resistor provided between one of two differential signals and an inversion input terminal of said operational amplifier; a second resistor, provided between the other one of two differential signals and a non-inversion input terminal of said operational amplifier, having a resistance value equal to that of said first resistor; a third resistor provided between an output terminal and the inversion input terminal of said operational amplifier; a fourth resistor, provided between a power source voltage and the non-inversion input terminal of said operational amplifier, having a resistance value approximately twice as large as that of said third resistor; and a fifth resistor, provided between the non-inversion input terminal of said operational amplifier and ground, having a resistance value substantially equal to that of said fourth resistor.

Accordingly, constructing the balance-to-single signal converting circuit without inputting a reference voltage from a circuit external to the AAF, the balance-to-single signal converting circuit does not receive any influence of the output impedance of a reference voltage generator and/or noise which can occur in the reference voltage generator.

BRIEF DESCRIPTION OF THE DRAWINGS

The above and other objects, advantages, and features of the present invention will be apparent from the following description taken in conjunction with the accompanying drawing, in which.

DETAILED DESCRIPTION OF THE PREFERRED EMBODIMENTS

Figure 1:
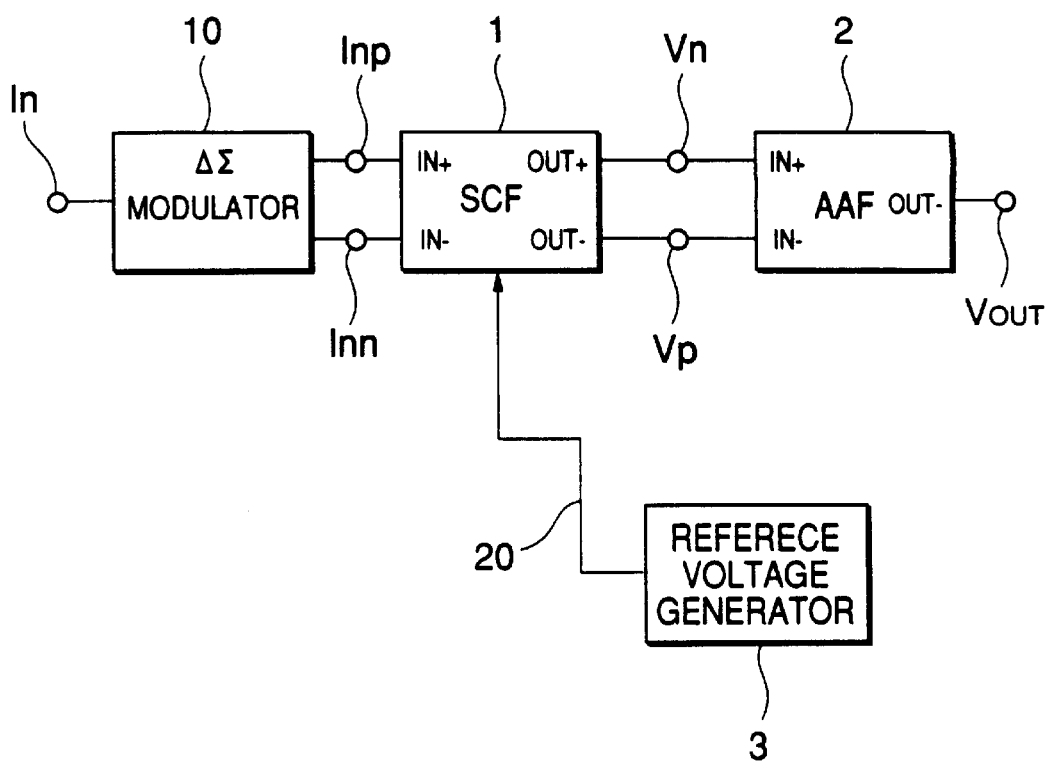
FIG. 1 is a block diagram showing the post filter using the balance-to-single signal converting circuit according to the first embodiment of the present invention.
Figure 2:
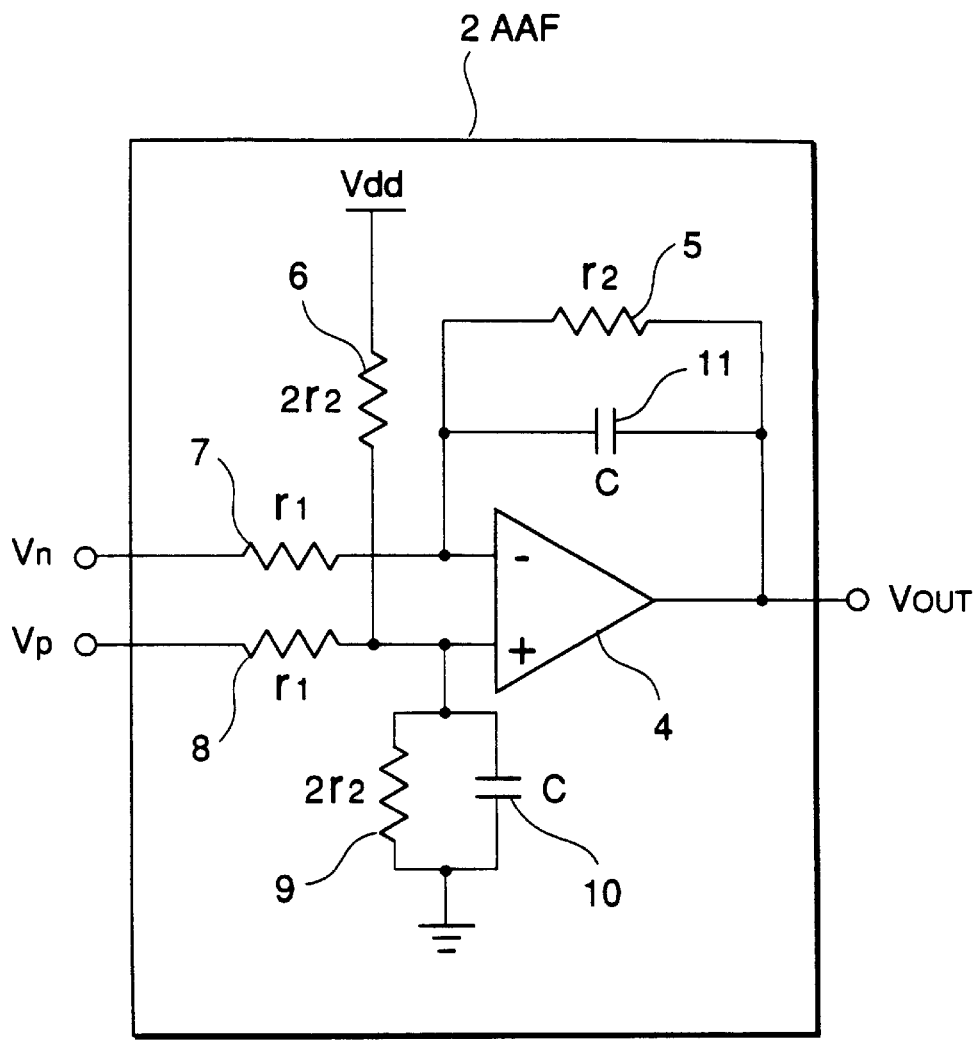
FIG. 2 is a circuit diagram showing the AAF 2 in FIG. 1.
Figure 3:
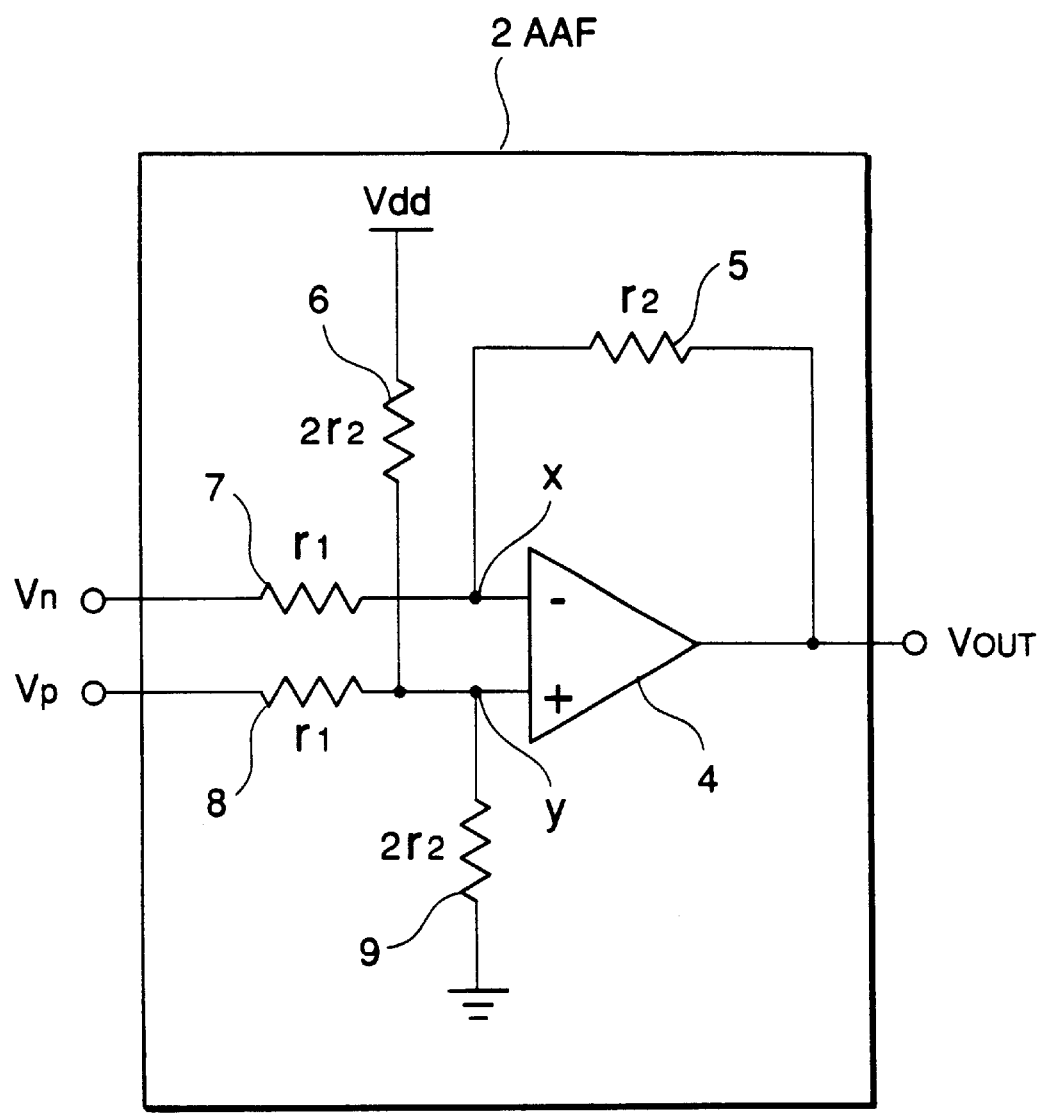
FIG. 3 is a circuit diagram for explaining the operation of the AAF 2 in FIG. 1.
Figure 9:
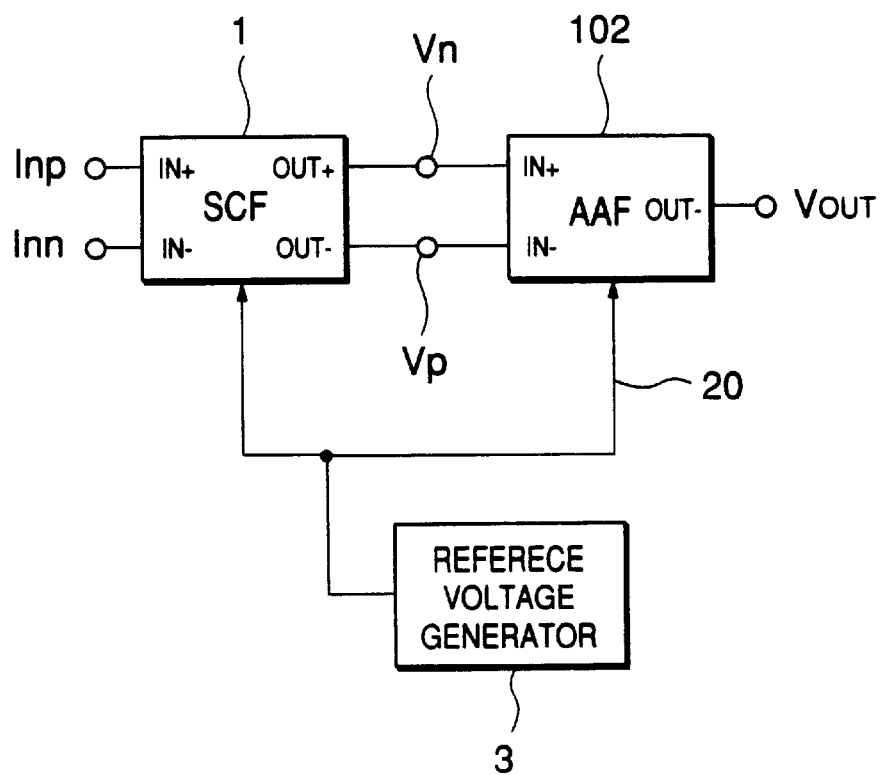
FIG. 9 is a block diagram showing a related post filter.

FIGS. 1 to 3 show a first embodiment of the present invention. It is noted that the numerals which are the same as those in FIG. 9 denote the same elements.

As shown in FIG. 1, the post filter comprises ΔΣ modulator 10, a SCF 1, a reference voltage generator 3, and an AAF 2 which does not receive the reference voltage 20 from the circuit 3. The ΔΣ modulator 10 receives an analogue signal In, which is produced by converting a digital signal to analogue signal and outputs phase difference modulation signals Inp and Inn which are complementary to each other. The details of the modulator 10 will be explained later.

As shown in FIG. 2, the AAF 2 comprises resistors 7 and 8 having resistance values $r_1$, a resistor 5 having a resistance value $r_2$, resistors 6 and 9 having resistance values $2r_2$, capacitors 10 and 11 having capacitance values C and an operational amplifier 4.

A differential signal Vn is inputted into an inversion input terminal of the operational amplifier 4 through the resistor 7. A differential signal Vp is inputted into a non-inversion input terminal of the operational amplifier 4 through the resistor 8. The resistor 5 and the capacitor 11 are connected in parallel between an output terminal and the inversion input terminal of the operational amplifier 4. The resistor 9 and the capacitor 10 are connected in parallel between a power supply voltage line, supplied with for example a ground voltage, as a first power source voltage and the non-inversion input terminal of the operational amplifier 4. The resistor 6 is connected between a power source line supplied with a power source voltage, for example Vdd, as a second power source voltage and the non-inversion input terminal of the operational amplifier 4. That is, the non-inversion input terminal of the operational amplifier 4 is supplied with a voltage which is obtained by a divided or shifted power source voltage, for example Vdd, by the resistors 6 and 9. Thus, a first power source line (e.g., ground) and a second power supply line, (e.g.,Vdd) are provided in the AAF 2.

For the sake of simplification of explanation a DC analysis is provided: assuming that capacitance value C=0 and the AAF 2 is a balance-to-single signal converting circuit without the LPF characteristic, the circuit has the construction as shown in FIG. 3. Next, referring to FIG. 3, a voltage Vx at a node x is expressed by equation 11.

$$Vx = \frac{r_2 \times Vn + r_1 \times Vout}{r_1 + r_2} \quad (11)$$

A voltage Vy at a node y is similarly expressed by equation 12.

$$Vy = \frac{Vdd + 2 \times r_2/r_1 \times Vp}{2 + 2 \times r_2/r_1} \quad (12)$$

Assuming that the open loop gain of the operational amplifier 4 is extremely large, the output signal Vout is expressed by equation 13.

$$Vout = \frac{1 + r_2/r_1}{2 + 2 \times r_2/r_1}\left\{Vdd + \frac{2 \times r_2}{r_1}Vp\right\} - \frac{r_2}{r_1}Vn \quad (13)$$

This equation can be transformed into equation 14.

$$Vout = \frac{1}{2}Vdd + \frac{r_2}{r_1}(Vp - Vn) \quad (14)$$

If the voltage Vc=Vdd/2 holds, the equation represents an ideal state the same as that represented by equation 5.

In the present embodiment, description has been made in case of capacitance C=0. However, the basic operation is the same in cases other than the case of capacitance C=0. If capacitance C does not equal 0, a function as an LPF frequency characteristic determined by the capacitance C and the resistance value $r_2$ is added to the function of the balance-to-single signal converting circuit.

As it is understood from equation 14, the balance-to-single signal converting circuit of the present embodiment has an ideal construction without a reference voltage input to the AFF circuit from an external circuit. As a result, the balance-to-single signal converting circuit does not receive influence from noise which occurs in a reference voltage generator. Further, in the balance-to-single signal converting circuit of the present embodiment, it is unnecessary to lower the output impedance of a reference voltage generator. As a result, the resistance of the resistors 6 and 9 can be large because the voltage Vc does not influence the resistors 6 and 9 due to the voltage Vc=Vdd/2. Accordingly, it is unnecessary to increase a circuit current or provide a large capacity external capacitor outside the LSI chip.

Also, since there is no fluctuation of middle point potential due to the differential signals Vp and Vn as inputs, which occurs in the case of using the reference voltage generator, there is no distortion in the output signal Vout.

Here, if the resistance value of the resistors 6 and 9 are $K \times r_2$, equation 14 is Vout=Vdd/K+$r_2/r_1$(Vp−Vn). That is, the voltage Vc is controlled by the constant value K.

Figure 4:
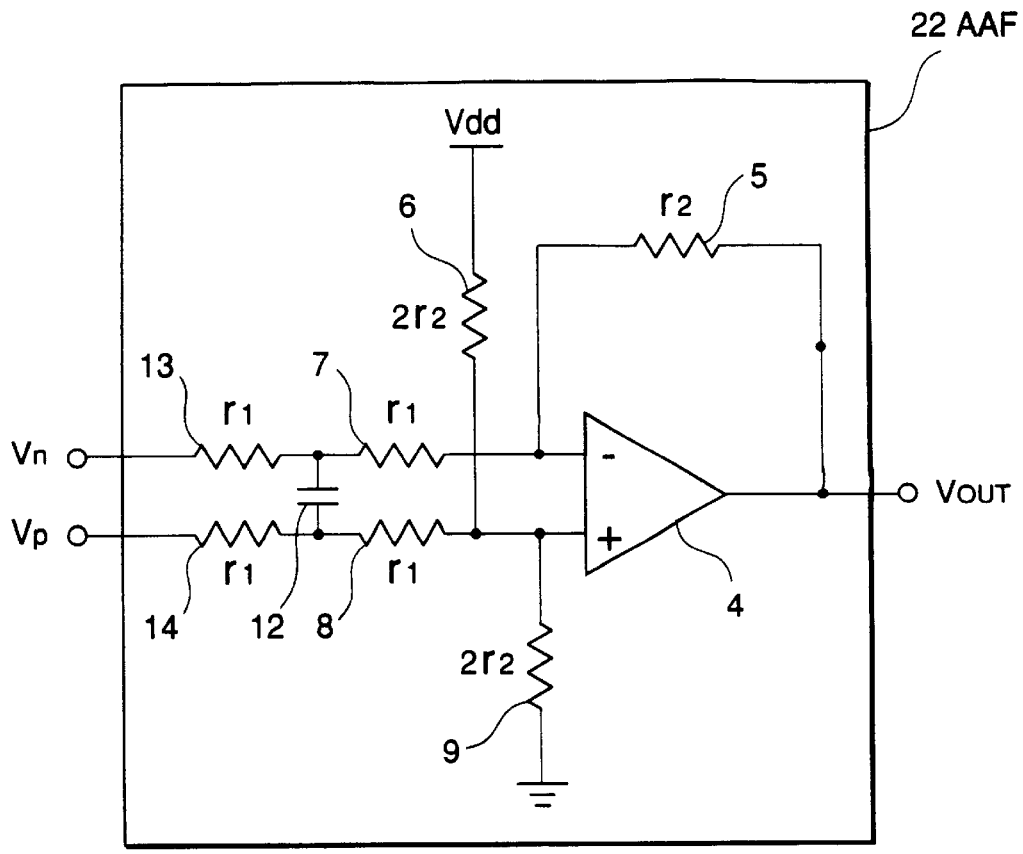
FIG. 4 is a circuit diagram showing the balance-to-single signal converting circuit according to the second embodiment of the present invention.

FIG. 4 is a circuit diagram showing the balance-to-single signal converting circuit according to a second embodiment of the present invention. In comparison with the AAF 2 in FIG. 3, AAF 22 of the second embodiment has a resistor 13 between the resistor 7 and an input terminal receiving the differential signal Vn, a resistor 14, having a resistance value equal to that of the resistor 13, between the resistor 8 and an input terminal receiving the differential signal Vp, and a capacitor 12 between a node where the resistor 13 is connected to the resistor 7 and a node where the resistor 14 is connected to the resistor 8.

In the above-described first embodiment, the LPF is constructed with the resistors 5 and 9 and the capacitors 10 and 11. However, in the second embodiment, the LPF is constructed with the resistors 13 and 14 and the capacitor 12.

Figure 5:
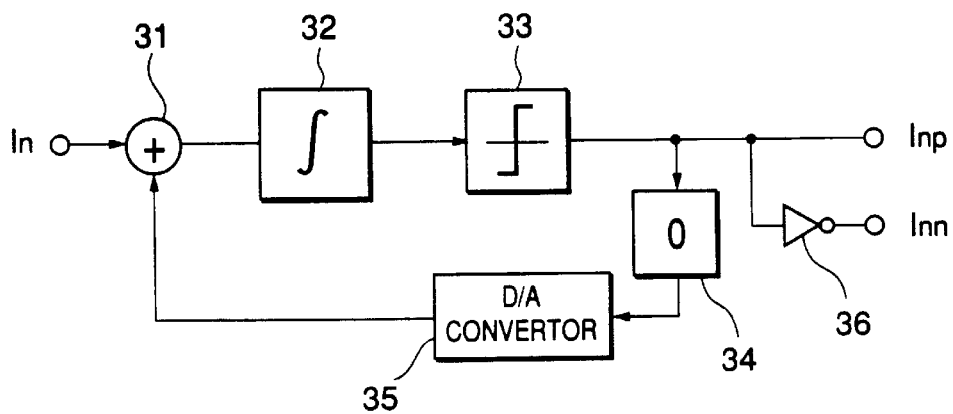
FIG. 5 is a block diagram showing the ΔΣ modulator of the present invention.
Figure 6A:
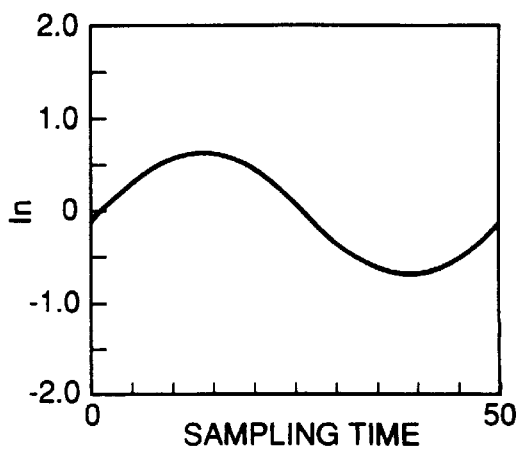
FIG. 6A is a diagram showing a waveform of an analogue signal which is inputted to the ΔΣ modulator shown in FIG. 5.
Figure 6B:
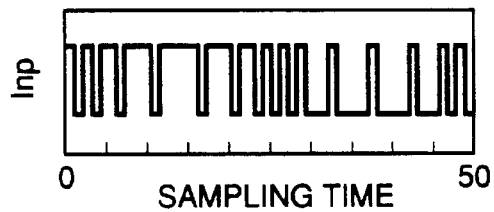
FIG. 6B is a diagram showing a waveform of phase differential modulation signal which outputted by the ΔΣ modulator shown FIG. 5.

FIG. 5 shows a block diagram of the ΔΣ modulator 10 used in the post filter of the present invention, shown in FIG. 1. This modulator 10 receives an analogue signal In shown in FIG. 6A. The analogue signal In is added with a signal output from a D/A convertor 35 by an adding circuit 31 and integrated by an integrating circuit 32. Thereafter, the integrated signal is compared by a comparator 33 to produce a phase difference modulation (PDM) signal Inp as shown in FIG. 6B. Further, a phase differential modulation signal Inn, which is complementary to the PDM signal Inp, is produced by an invertor 36. Further, the PDM signal Inp is inputted to a delay circuit 34 and its delayed PDM signal is inputted to the D/A convertor 35 to produce an analogue signal, which is inputted to the adding circuit 31.

Figure 6C:
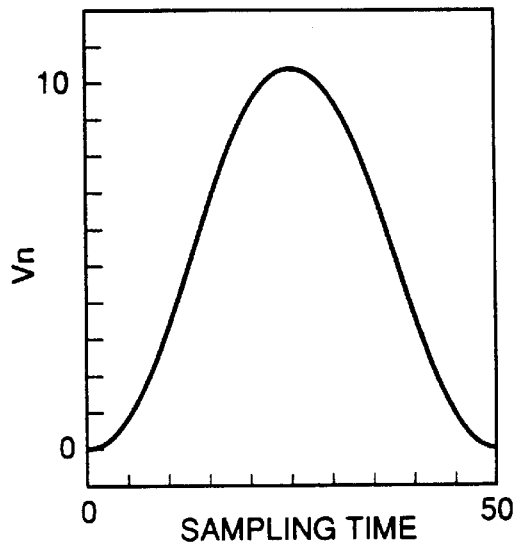
FIG. 6C is a diagram showing waveform of a sampling analogue signal made outputted by the SCF.
Figure 7A:
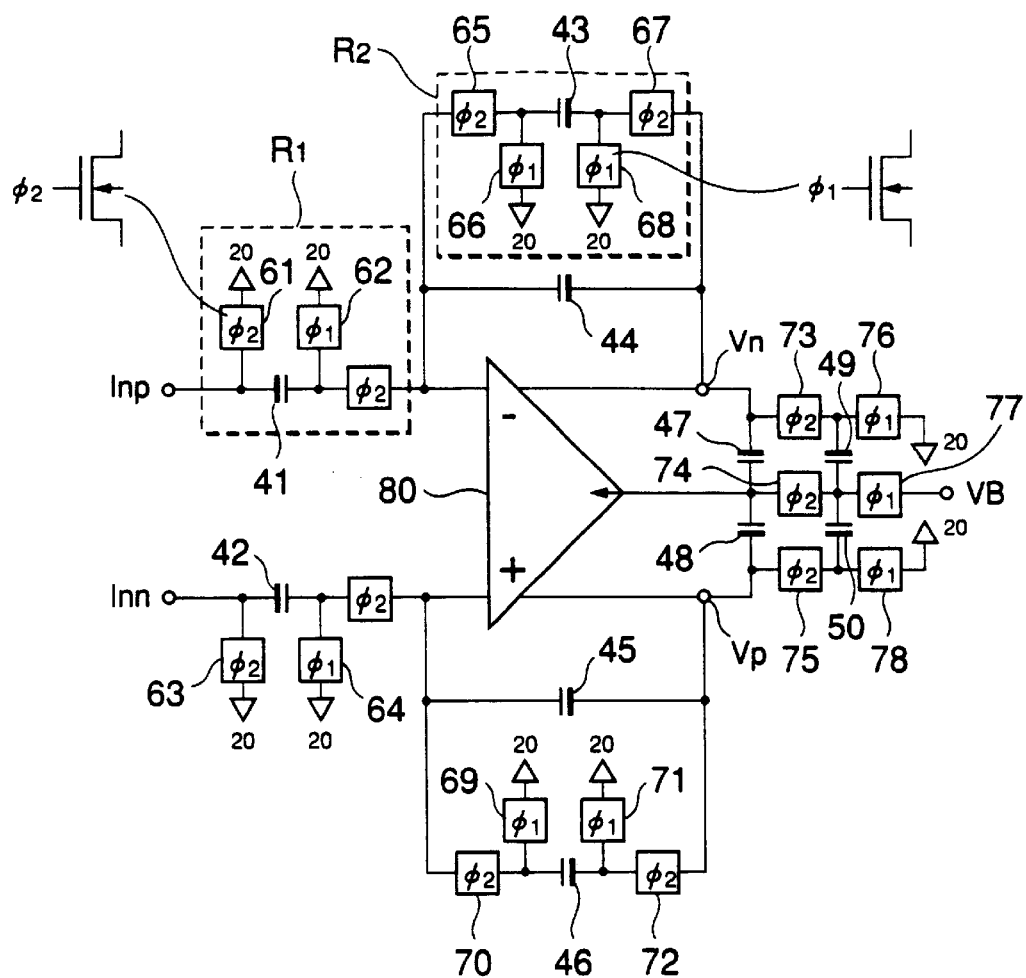
FIG. 7A is a block diagram for showing the SCF shown in FIG. 1 of the present invention and FIG. 7B is a diagram showing waveforms of the clock signals shown in FIG. 7A.
Figure 7B:
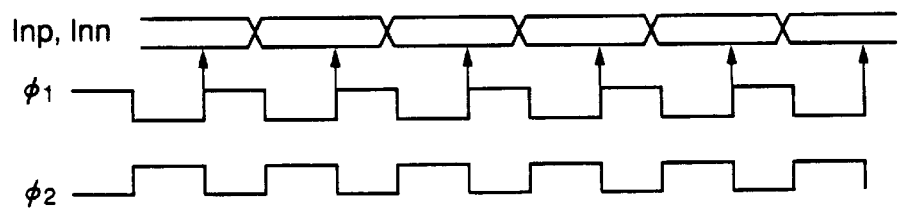
Figure 10:
FIG. 10 is a diagram showing waveforms of the respective elements of the post filter in FIG. 9.
Figure 10:
Figure 10:
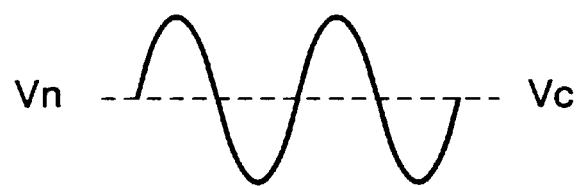
Figure 10:
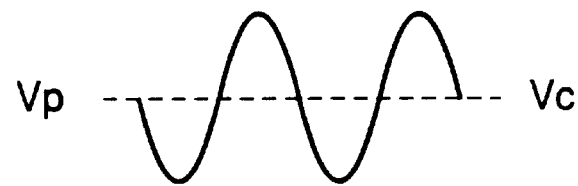
Figure 10:
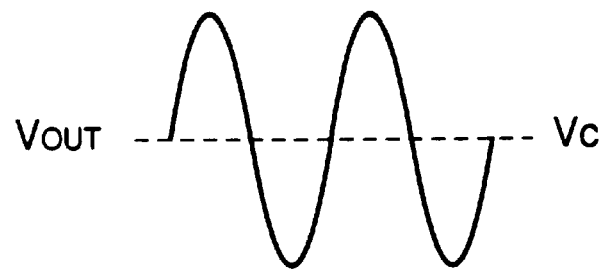
Figure 11:
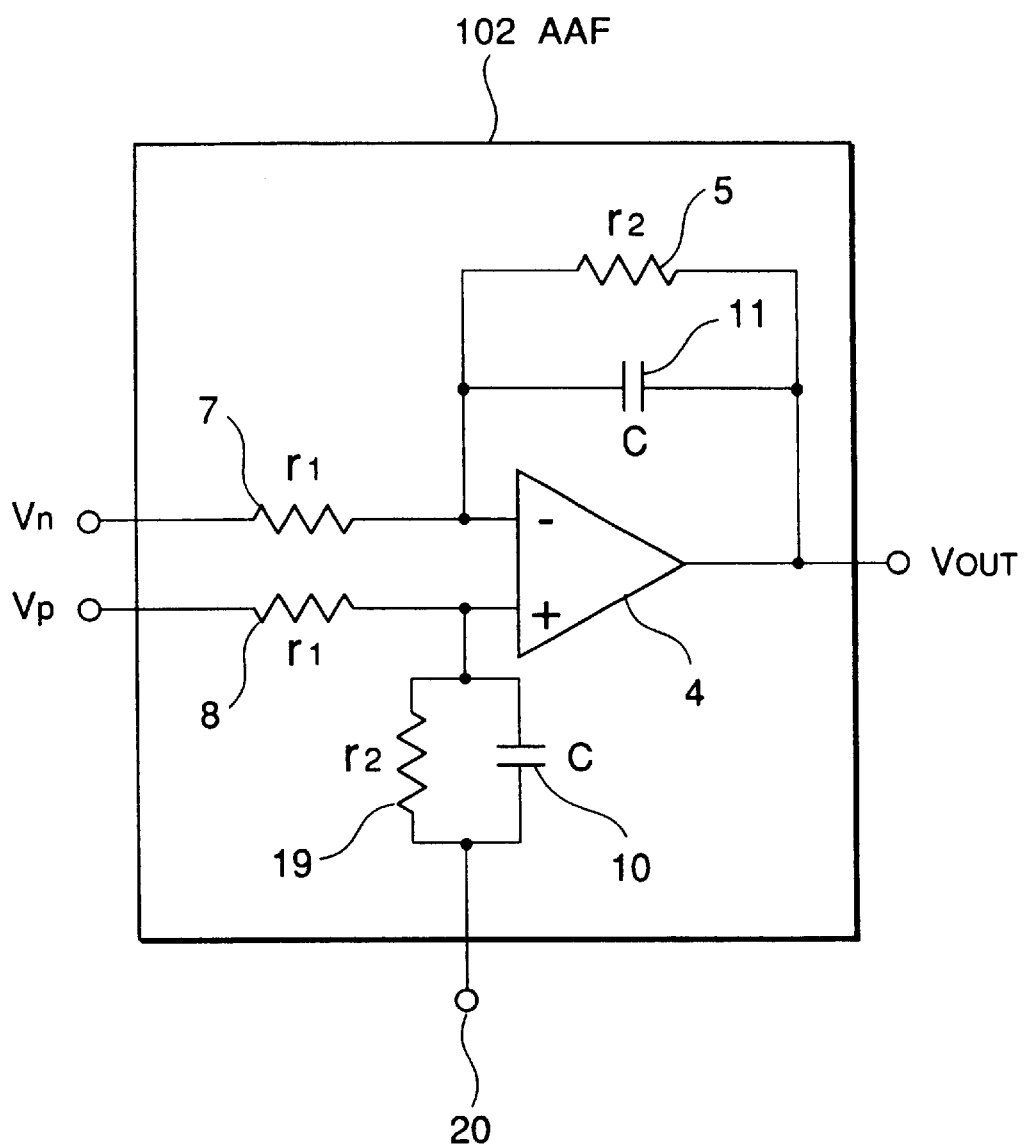
FIG. 11 is a circuit diagram showing the AAF 2 of FIG. 8.
Figure 12:
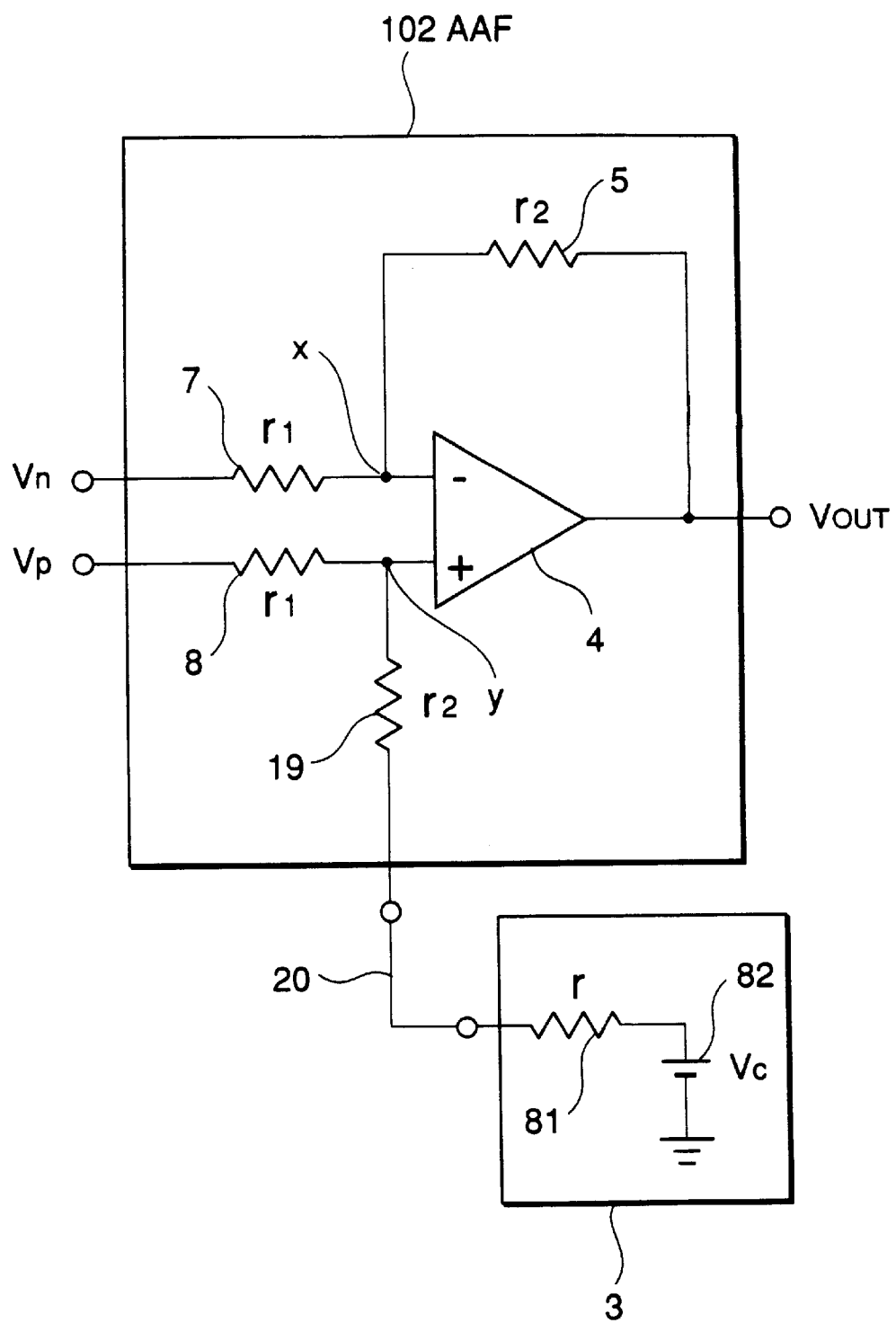
FIG. 12 is a circuit diagram for explaining the operation of the AAF 2 in FIG. 9.
Figure 13:
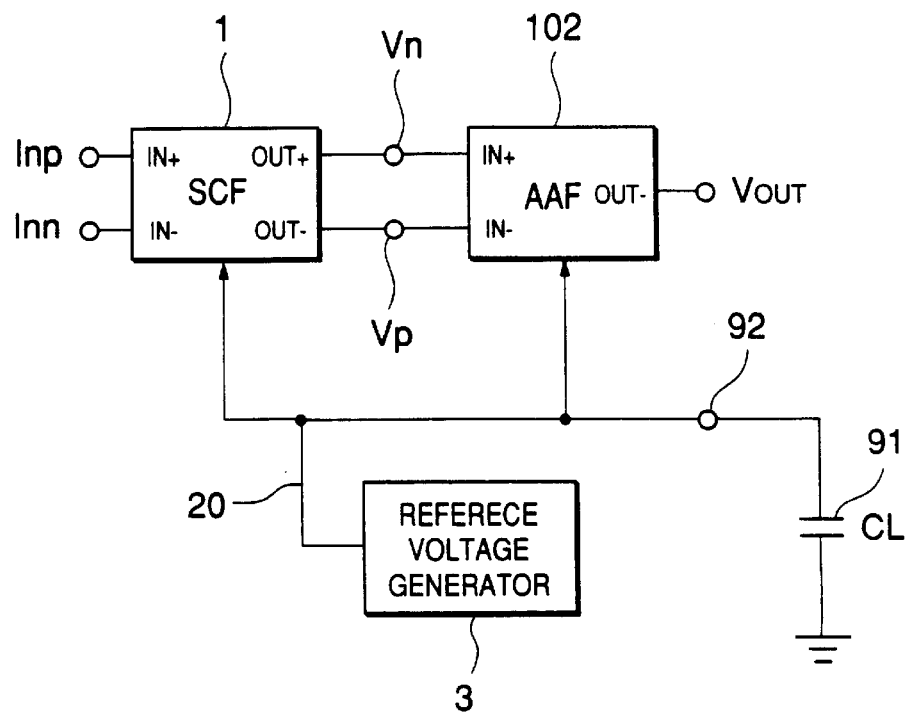
FIG. 13 is a block diagram in a case where the post filter in FIG. 9 is connected to an external capacitor.
Figures 14A, 14B:
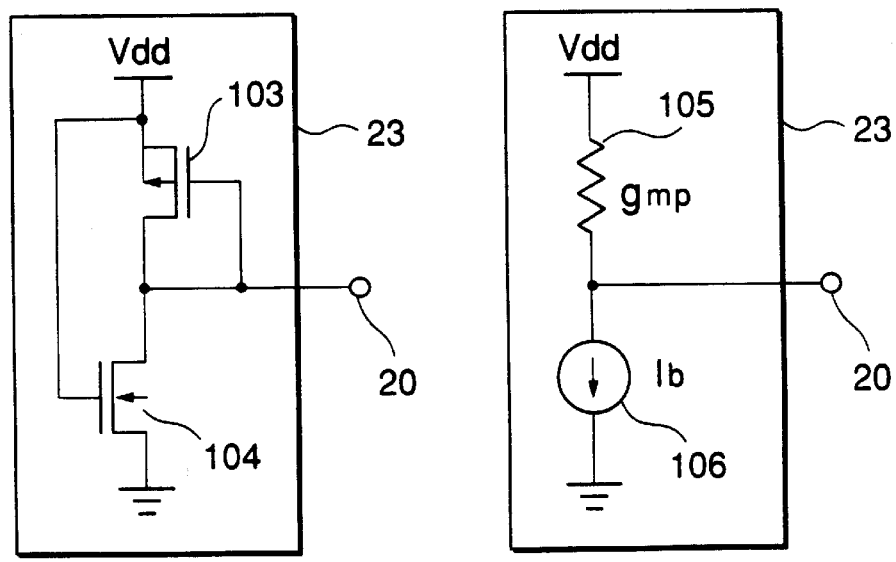
FIG. 14A is a circuit diagram showing an alternative reference voltage generator 23 and FIG. 14B shows an equivalent circuit of the circuit in FIG. 14A.
Figure 15:
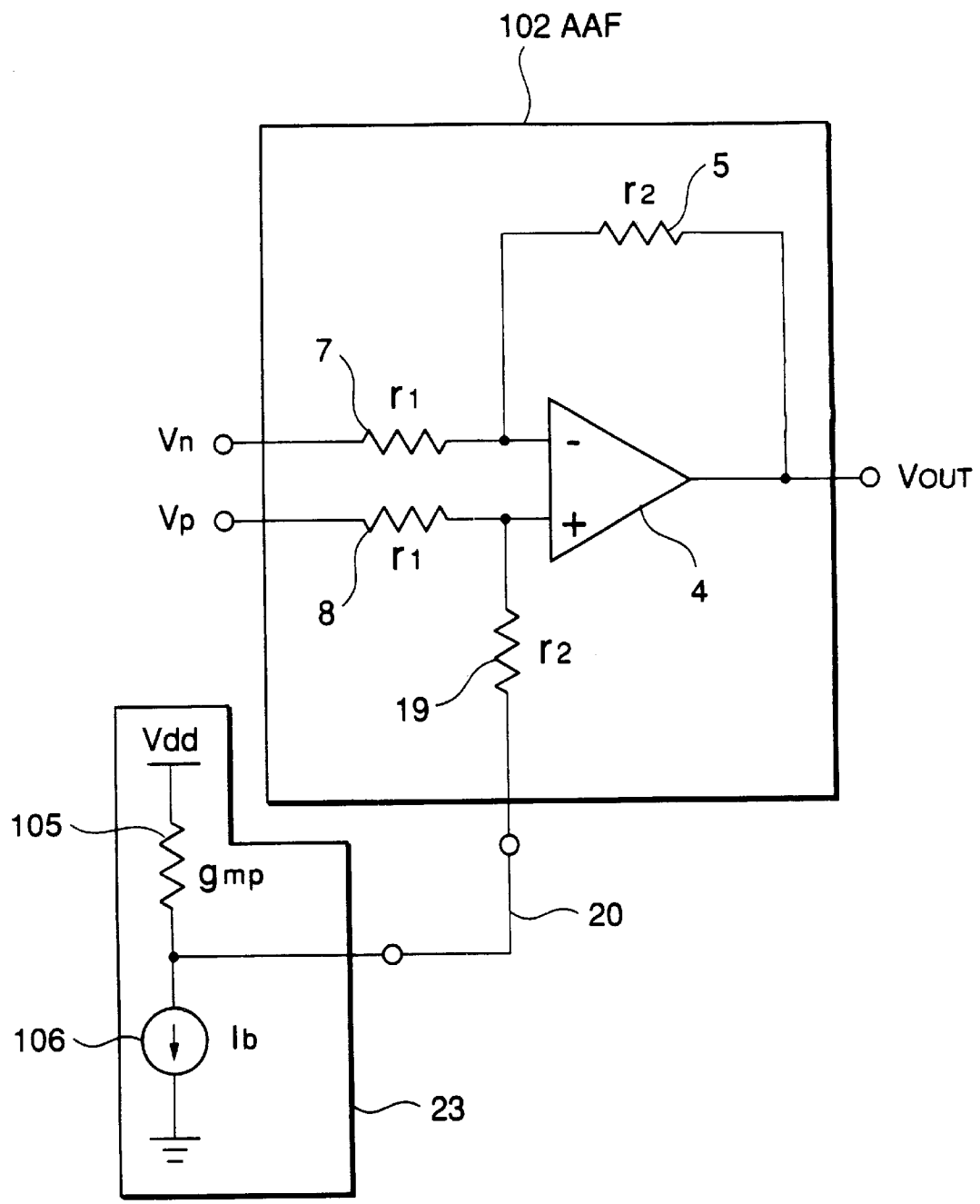
FIG. 15 is a circuit diagram for explaining the operations of the reference voltage generator 23 and the AAF 102 for FIGS. 9 and 14.

FIG. 7A is a block diagram of the SCF 1 of the present invention and FIG. 7B is a diagram showing waveform of clock signals ø1 and ø2 shown in FIG. 7A. The SCF 1 outputs the signal Vn as shown in FIG. 6C in response to the signal Inp. The Vp is complementary signal to the signal Vn as shown in FIG. 10.

The SCF 1 comprises an operational amplifier 80, first switches 62, 64, 66, 68, 69, 71, 76, 77, and 78 receiving the clock signal 01, second switches 61, 63, 65, 67, 70, 72, 73, 74 and 75 and capacitors 41 through 50. Each of the switches receiving the clock signal ol like the switch 68 is composed of an n-type MOS transistor whose gate is inputted by the clock signal ø1. Similarly, each of the switches receiving the clock signal ø2 like the switch 61 is composed of an n-type MOS transistor whose gate is inputted the clock signal ø2. The switches 61, 62, 63, 64, 66, 68, 69, 71, 76, and 78 are supplied with the reference voltage 20 as shown in FIG. 1. A voltage VB is an another reference voltage.

Figure 8:
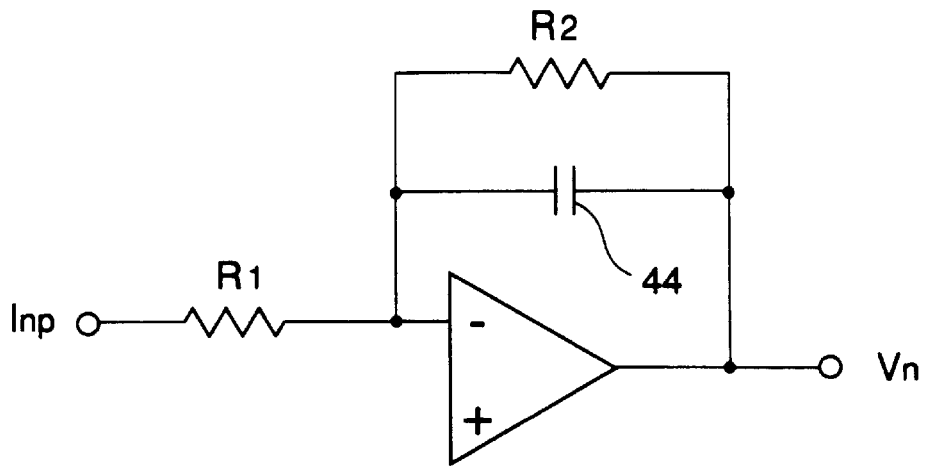
FIG. 8 is a simplified diagram showing the basic principle of the SCF in FIG. 7A.

Next, basic principles of the SCF 1 will be simply explained. Here, since a side where the signal Inp is input and a side where the signal Inn is input are the same structure as each other, the side where the signal Inp is inputted will be explained and the side where the signal Inn is inputted is omitted. Further, since the capacitors 49 and 50 and the switches 73 to 78 are provided for equalizing the voltages Vn and Vp, which is called a common feed back system, the explanation is omitted. The capacitor 41 is charged or discharged by switching the switches 61 and 62 ON/OFF. An equivalent circuit for the capacitor and switches is a load resistor R1 through which current flows. The resistance of the resistor R1 is controlled by the frequency of the clock signals ø1 and ø2. Similarly, the capacitor 43 and switches 65 to 68 may be regarded as a resistor R2. Therefore, the circuit structure of the side receiving the signal Inp can be regarded as the equivalent circuit shown in FIG. 8.

This circuit is a kind of a RC integrating circuit which has the integrating constant value RC (R is the value based on the resistors R1 and R2 and C is the capacitance of the capacitor 44). The integrating constant value RC is controlled by the clock signals ø1 and ø2. Similarly, the SCF 1 produces the signals Vp in response to the signal Inn. Consequently, the SCF 1 and the modulator 10 produces the integrating signal Vn and its complement Vp, shown in FIG. 6C, in response to the signal shown in FIG. 6A.

As described above, the present invention has the following effects. First, since it is unnecessary to lower the impedance of a reference voltage generator, the circuit current can be reduced. Second, since it is unnecessary to provide a large capacitance external capacitor to lower the impedance of a reference voltage generator, the chip area of the LSI can be reduced, and the cost can be reduced. Finally, there is no influence of noise from a reference voltage generator. Thus distortion in the output voltage, Vout, can be reduced.

It is apparent from the specification that the present invention is not limited to the above-described embodiments but may be modified and changed without departing from the scope and spirit of the invention. For example, the resistors 6 and 9 may be replaced by MOS transistors having linear characteristic which function in the linear region.

What is claimed is:

1. A semiconductor circuit comprising:
   an operational amplifier having a first input terminal, a second input terminal, and an output terminal;
   a first resistor coupled between said first input terminal and said output terminal; and
   second and third resistors coupled to said second input terminal and coupled between a first power source and a second power source, each of said second and third resistors having a resistance value about twice as large as that of said first resistor;
   wherein said operational amplifier is supplied at said second input terminal with a voltage obtained by dividing a power source voltage supplied with said first power source by said second and third resistors.

2. A semiconductor circuit, comprising:
   an operational amplifier;
   a first resistor coupled between a first terminal and an inversion input terminal of said operational amplifier;
   a second resistor coupled between a second terminal and a non-inversion input terminal of said operational amplifier;
   a third resistor coupled between an output terminal and said inversion input terminal of said operational amplifier;
   a fourth resistor coupled between a first power source line and said non-inversion input terminal of said operational amplifier, wherein said fourth resistor has a resistance value about twice as large as that of said third resistor; and
   a fifth resistor coupled between said non-inversion input terminal of said operational amplifier and a second power source line.

3. The circuit as claimed in claim 2, wherein said fifth resistor has a resistance value substantially equal to that of said fourth resistor.

4. The circuit as claimed in claim 2, wherein said second resistor has a resistance value substantially equal to that of said first resistor.

5. A semiconductor circuit, comprising:
   an operational amplifier;
   a first resistor coupled between a first terminal and an inversion input terminal of said operational amplifier;
   a second resistor coupled between a second terminal and a non-inversion input terminal of said operational amplifier;
   a third resistor coupled between an output terminal and said inversion input terminal of said operational amplifier;
   a fourth resistor coupled between a first power source line and said non-inversion input terminal of said operational amplifier;
   a fifth resistor coupled between said non-inversion input terminal of said operational amplifier and a second power source line;
   a first capacitor coupled parallel to said third resistor; and
   a second capacitor coupled parallel to said fifth resistor.

6. The circuit as claimed in claim 5, wherein said second capacitor has a capacitance value substantially equal to that of said first capacitor.

7. A semiconductor circuit, comprising:
   an operational amplifier;
   a first resistor coupled between a first terminal and an inversion input terminal of said operational amplifier;
   a second resistor coupled between a second terminal and a non-inversion input terminal of said operational amplifier;
   a third resistor coupled between an output terminal and said inversion input terminal of said operational amplifier;

a fourth resistor coupled between a first power source line and said non-inversion input terminal of said operational amplifier;

a fifth resistor coupled between said non-inversion input terminal of said operational amplifier and a second power source line;

a sixth resistor coupled between said first terminal and said first resistor;

a seventh resistor coupled between said second terminal and said second resistor; and a first capacitor coupled between a portion where said first resistor is coupled to said sixth resistor and a portion where said second resistor is coupled to said seventh resistor.

8. The circuit as claimed in claim 7, wherein said seventh resistor has a resistance value substantially equal to that of said sixth resistor.

9. The circuit as claimed in claim 1, further comprising:

a fourth resistor coupled to said first input terminal of said operational amplifier, said fourth resistor having an end receiving a first difference signal;

a fifth resistor coupled to said second input terminal of said operational amplifier, said fifth resistor having an end receiving a second difference signal;

a first capacitor coupled parallel to said first resistor; and a second capacitor coupled parallel to said second resistor.

10. The circuit as claimed in claim 9, wherein each said fourth and fifth resistors has a resistance value substantially the same as that of said first resistor.

11. The circuit as claimed in claim 10, wherein said second capacitor has a capacitance value substantially equal to that of said first capacitor.

12. The circuit as claimed in claim 1, further comprising:

fourth and fifth resistors in serial coupled to said first input terminal of said operational amplifier, said fifth resistor having an end receiving a first difference signal;

a sixth and seventh resistors in serial coupled to said second input terminal of said operational amplifier, said seventh resistor having an end receiving a second difference signal; and a first capacitor coupled between a first connecting point between said fourth and firth resistors and a second connecting point between said sixth and seventh resistors.

13. The circuit as claimed in claim 12, wherein each said fourth and sixth resistors has a resistance value substantially the same as that of said first resistor.

* * * * *